United States Patent
Levi et al.

(10) Patent No.: US 10,731,979 B2
(45) Date of Patent: Aug. 4, 2020

(54) METHOD FOR MONITORING NANOMETRIC STRUCTURES

(71) Applicant: Applied Materials Israel, Ltd., Rehovot (IL)

(72) Inventors: Shimon Levi, Kiryat-Tivon (IL); Ishai Schwarzband, Or-Yehuda (IL); Roman Kris, Jerusalem (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 15/870,622

(22) Filed: Jan. 12, 2018

(65) Prior Publication Data
US 2019/0219390 A1   Jul. 18, 2019

(51) Int. Cl.
| | |
|---|---|
| *G01B 15/08* | (2006.01) |
| *G03F 7/20* | (2006.01) |
| *G01B 15/00* | (2006.01) |
| *B82Y 35/00* | (2011.01) |

(52) U.S. Cl.
CPC ............ *G01B 15/08* (2013.01); *G01B 15/00* (2013.01); *G03F 7/70625* (2013.01); *B82Y 35/00* (2013.01); *G01B 2210/56* (2013.01); *G03F 7/70466* (2013.01)

(58) Field of Classification Search
CPC ............ G01B 15/08; H01J 2237/2814; G03F 7/70625
See application file for complete search history.

(56) References Cited

U.S. PATENT DOCUMENTS

| | | | | |
|---|---|---|---|---|
| 6,566,655 | B1* | 5/2003 | Choo | G01N 23/2251 250/306 |
| 8,952,329 | B1* | 2/2015 | Shih | G03F 7/705 250/307 |
| 2005/0282300 | A1 | 12/2005 | Yun et al. | |
| 2005/0285034 | A1* | 12/2005 | Tanaka | H01J 37/28 250/310 |
| 2006/0036409 | A1* | 2/2006 | Yamaguchi | G01B 15/08 702/189 |
| 2009/0045335 | A1 | 2/2009 | Obara et al. | |
| 2010/0314541 | A1 | 12/2010 | Sasajima et al. | |
| 2013/0107030 | A1 | 5/2013 | Koptyaev et al. | |

FOREIGN PATENT DOCUMENTS

KR   19970023940   5/1997

OTHER PUBLICATIONS

PCT Application No. PCT/US2019/013082, International Search Report and Written Opinion, dated Apr. 30, 2019, 7 pages.

* cited by examiner

*Primary Examiner* — Eliza W Osenbaugh-Stewart
(74) *Attorney, Agent, or Firm* — Lowenstein Sandler LLP

(57) ABSTRACT

A method for monitoring a first nanometric structure formed by a multiple patterning process, the method may include performing a first plurality of measurements to provide a first plurality of measurement results; wherein the performing of the first plurality of measurements comprises illuminating first plurality of locations of a first sidewall of the first nanometric structure by oblique charged particle beams of different tilt angles; and processing, by a hardware processor, the first plurality of measurement results to determine a first attribute of the first nanometric structure.

19 Claims, 7 Drawing Sheets

METHOD FOR MONITORING NANOMETRIC STRUCTURES

BACKGROUND

Technical Field

Embodiments of the present invention relate to a system, a method and a computer storage medium for monitoring nanometric structures using charged particle beams.

Description of Related Art

Multiple patterning (or multi-patterning) is defined in Wikipedia as a class of technologies for manufacturing integrated circuits, developed for photolithography to enhance the feature density. It is expected to be necessary for the upcoming 10 nm and 7 nm node semiconductor processes and beyond. The premise is that a single lithographic exposure may not be enough to provide sufficient resolution. Hence additional exposures would be needed, or else positioning patterns using etched feature sidewalls (using spacers) would be necessary.

In spacer patterning, a spacer is a film layer formed on the sidewall of a pre-patterned feature. A spacer is formed by deposition or reaction of the film on the previous pattern, followed by etching to remove all the film material on the horizontal surfaces, leaving only the material on the sidewalls. By removing the original patterned feature, only the spacer is left. However, since there are two spacers for every line, the line density has now doubled. This is commonly referred to as Self-Aligned Double Patterning (SADP). The spacer technique is applicable for defining narrow gates at half the original lithographic pitch, for example.

As pitch splitting has become more difficult due to possible differences in feature positions between different exposed parts, sidewall image transfer (SIT) has become more recognized as the necessary approach. The SIT approach typically requires a spacer layer to be formed on an etched feature's sidewall. If this spacer corresponds to a conducting feature, then ultimately it must be cut at no less than two locations to separate the feature into two or more conducting lines as typically expected. On the other hand, if the spacer corresponds to a dielectric feature, cutting would not be necessary.

The spacers may suffer from problematic critical dimension uniformity and pitch walking.

When SADP is repeated, an additional halving of the pitch is achieved. This is often referred to as Self-Aligned Quadruple Patterning (SAQP).

There is a growing need to provide effective methods for monitoring nanometric structures manufactured by a multi patterning process.

SUMMARY

The summary is not intended to limit the scope of the claims.

There may be provided a method for monitoring a first nanometric structure formed by a multiple patterning process, the method may include (a) performing a first plurality of measurements to provide a first plurality of measurement results; wherein the performing of the first plurality of measurements comprises illuminating first plurality of locations of a first sidewall of the first nanometric structure by oblique charged particle beams of different tilt angles; and (b) processing, by a hardware processor, the first plurality of measurement results to determine a first attribute of the first nanometric structure.

There may be provided a computer storage medium which stores program instructions being configured to perform, when executed on a processor, steps of: receiving a first plurality of measurement results that were obtained from a first plurality of measurements that comprise illuminating first plurality of locations of a first sidewall of a first nanometric structure by oblique charged particle beams of different tilt angles; and processing the first plurality of measurement results to determine a first attribute of the first nanometric structure.

There may be provided a system which comprises at least a processor and a memory having program instructions stored thereon, the processor being configured to perform, when executing the program instructions, steps of: receiving a first plurality of measurement results that were obtained from a first plurality of measurements that comprise illuminating first plurality of locations of a first sidewall of a first nanometric structure by oblique charged particle beams of different tilt angles; and processing the first plurality of measurement results to determine a first attribute of the first nanometric structure.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
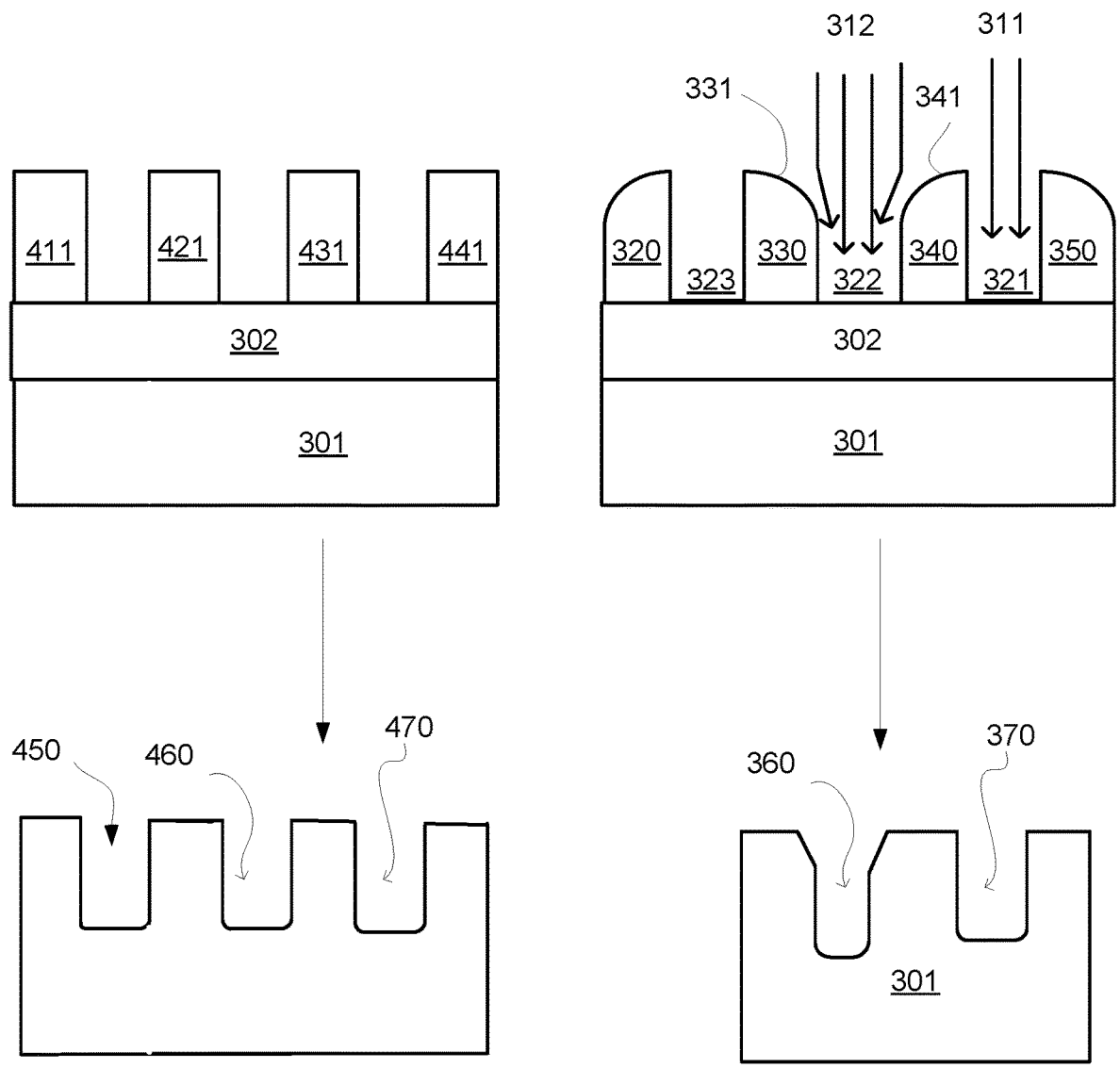
FIG. 1 is an example of various steps of a SAQP process applied on ideal spacers and on non-ideal spacers.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term "comprising" is synonymous with (means the same thing as) "including," "containing" or "having" and is inclusive or open-ended and does not exclude additional, unrecited elements or method steps.

The term "consisting" is a closed (only includes exactly what is stated) and excludes any additional, unrecited elements or method steps.

The term "consisting essentially of" limits the scope to specified materials or steps and those that do not materially affect the basic and novel characteristics.

In the claims and specification any reference to the term "comprising" (or "including" or "containing") should be applied mutatis mutandis to the term "consisting" and should be applied mutatis mutandis to the phrase "consisting essentially of".

There is provided a method and a computer program product for evaluating nanometric structures manufactured by a multiple patterning process.

The evaluating may include:
a. Performing multiple measurements to provide multiple measurement results. The multiple measurements are obtained at different locations along one or more sidewall of the nanometric structure, and at different angles of illumination. The different angles of illumination are oblique angles and the illumination may not include vertical illumination. Step (a) may include acquiring tilted images of the nanometric structure.
b. Processing the multiple measurement results to determine an attribute of the nanometric structure.

The nanometric structure may protrude from its environment or may be a cavity.

The attribute of the nanometric structure may be related to any edge of the nanometric structure, to any sidewall of the nanometric structure, to a spatial relationship between multiple nanometric structures, or to any spatial relationship between different parts of a single nanometric structure. Non-limiting examples of the attribute include an edge roughness, any edge related statistics, a sidewall tilt, any sidewall tilt related statistics, sidewall heights, any sidewall height statistics, a depth of any cavity, a deviation from expected value, and the like. The attribute of the nanometric structure may be a size attribute, a shape attribute, or a combination of shape and size attributes.

FIG. 1 illustrates an example of first ideal spacer 411, second ideal spacer 421, third ideal spacer 431, and fourth ideal spacer 441. The first till fourth ideal spacers are deposited on top mandrel 302 that in turn is positioned on bottom mandrel 301. The spacers are ideal in the sense that they are error free, each spacer has a top surface that is uniform and horizontal, and each spacer has vertical and uniform sidewalls.

FIG. 1 also illustrates that an outcome of an ion etch process that is applied on the first till fourth ideal spacers in a formation, in bottom mandrel 301, of first cavity 450, second cavity 460, and third cavity 470. The first till third cavities are uniform and evenly-spaced from each other.

FIG. 1 also illustrates an example of first non-ideal spacer 320, second non-ideal spacer 330, third non-ideal spacer 340, and fourth non-ideal spacer 350. The first till fourth non-ideal spacers are deposited on top mandrel 302, that is deposited on bottom mandrel 301. The spacers are non-ideal in the sense that each non-ideal spacer have a curved top surface. The spacers may also suffers from height nonuniformity, edge roughness, and the like.

A first gap 321 between the third non-ideal spacer 340 and fourth non-ideal spacer 350 is formed by the sidewalls of the third non-ideal spacer 340 and fourth non-ideal spacer 350.

The curved top surface 331 of the second non-ideal spacer 330 and the curved top surface 341 of the third non-ideal spacer 340 face the second gap 322.

Third gap 323 between the first non-ideal spacer 320 and third non-ideal spacer 340 is formed by the sidelines of the first non-ideal spacer 320 and third non-ideal spacer 340.

Second gap 322 allows milling of top mandrel 302 and bottom mandrel 301 by ions scattered from the curved top surfaces of the third non-ideal spacer 340 and the second non-ideal spacer 330.

Accordingly, ion beams 312 from a second angular range may pass through second gap 322, while ion beams 311 from a first angular range (that is smaller than the second angular range) may pass through first gap 321.

The difference between the first and second angular ranges introduce a difference between the shapes and sizes of cavities 360 and 370 that are formed in bottom mandrel 301.

While FIG. 1 illustrates the non-ideal spacers as including vertical sidewalls—this is usually not the case and the sidewalls of non-ideal spacers may be tilted and suffer from top edge roughness, bottom edge roughness and sidewall height variations.

Figure 2:
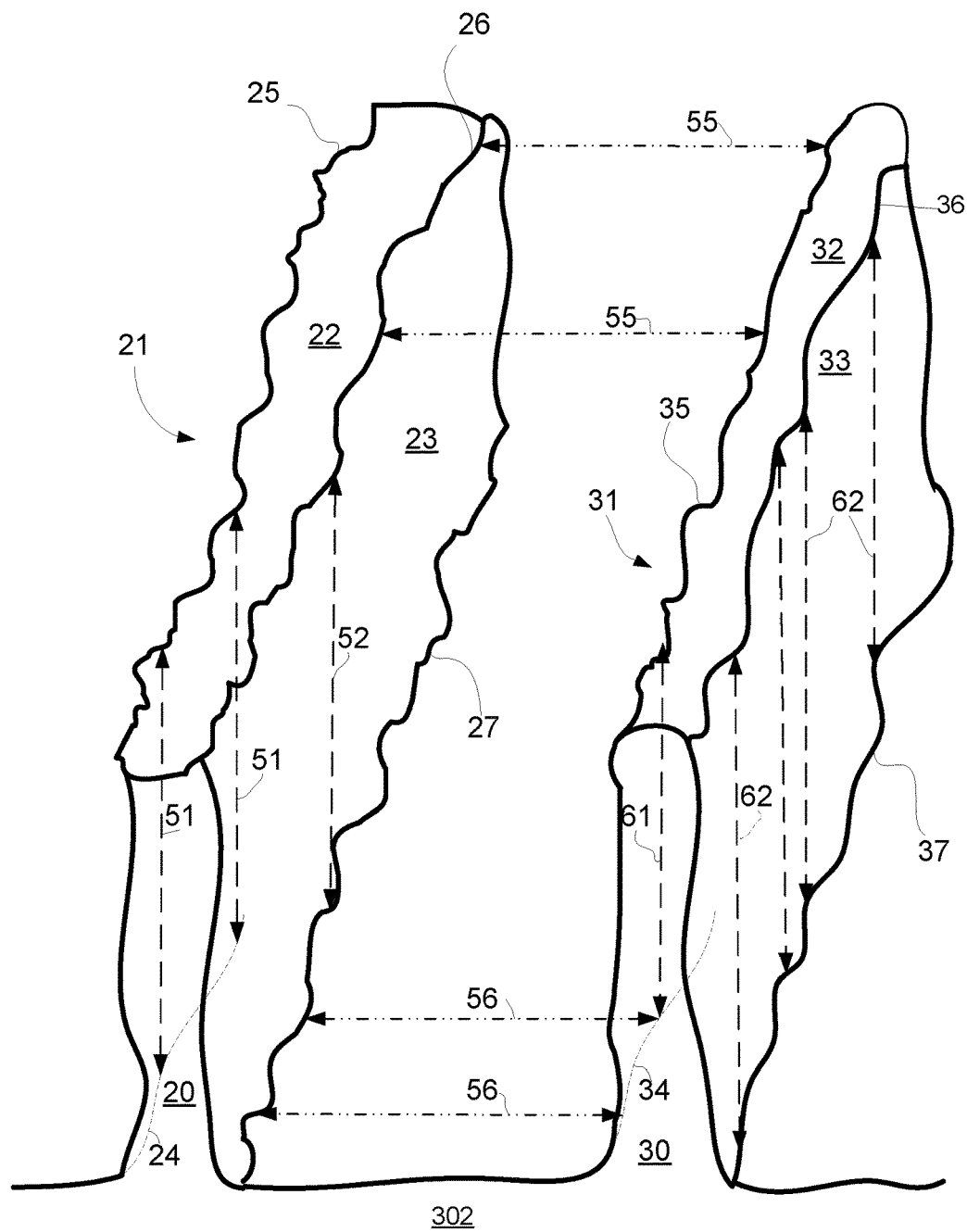
FIG. 2 is an example of non-ideal spacers.

FIG. 2 illustrates an example of non-ideal spacers such as first spacer 20 and second spacer 30. FIG. 2 also illustrated a gap between the first spacer 20 and the second spacer 30.

First spacer 20 includes: (a) first left sidewall 21, (b) first top surface 22, (c) first right sidewall 23, (d) first left top edge 25 that is defined by first left sidewall 21 and first top surface 22, (e) first left bottom edge 24 defined between first left sidewall 21 and top mandrel 302, (f) first right top edge 26 defined between first top surface 22 and first right sidewall 23, and (g) first right bottom edge 27 defined between first right sidewall 23 and top mandrel 302.

First left sidewall 21 is tilted and has a non-uniform height. The non-uniform height of first left sidewall 21 results from the roughness of the first left top edge 25 and the roughness of the first left bottom edge 24.

First right sidewall 23 is tilted and has a non-uniform height. The non-uniform height of first right sidewall 23 results from the roughness of the right top edge 26 and the roughness of the first right bottom edge 27.

Second spacer 30 includes: (a) second left sidewall 31, (b) second top surface 32, (c) second right sidewall 33, (d) second left top edge 35 that is defined by second left sidewall 31 and second top surface 32, (e) second left bottom edge 35 defined between second left sidewall 31 and top mandrel 302, (f) second right top edge 36 defined between second top surface 32 and second right sidewall 33, and (g) second right bottom edge 37 defined between second right sidewall 33 and top mandrel 302.

Second left sidewall 31 is tilted and has a non-uniform height. The non-uniform height of second left sidewall 31 results from the roughness of the second left top edge 35 and the roughness of the second left bottom edge 34.

Second right sidewall 33 is tilted and has a non-uniform height. The non-uniform height of second right sidewall 33 results from the roughness of the second right top edge 36 and the roughness of the second right bottom edge 37.

The width of the gap between the first spacer 20 and the second spacer 30 is nonuniform—due to the tilt and non-uniformity of each one of the first right sidewall 23 and the second left sidewall 31.

FIG. 2 illustrates two height measurements 51 of the first left sidewall 21, one height measurement 52 of the first right sidewall 23, one height measurement 61 of the second left sidewall 31, and four height measurements 62 of the second right sidewall 33.

It should be noted that (a) multiple height measurements can be performed for each one of the sidewalls of the first and second spacers, (b) the number of height measurements per sidewall may be any integer number, (c) the number of height measurements of all sidewalls may be the same, (d) one sidewall can be measured more times that another sidewall, (e) spacings between different height measurement may be the same or may differ from each other.

It should be noted that any height measurement may be affected by the tilt of the sidewall. When the tilt of the sidewall is not known then the sidewall may be measured from different angles—by illuminating the sidewall with charged particle beams of different angles of illumination.

FIG. 2 further illustrates two distance measurements 56 between first right bottom edge 27 and second left bottom edge 34, and two distance measurements 55 between first right top edge 26 and second left top edge 35.

Figure 3:
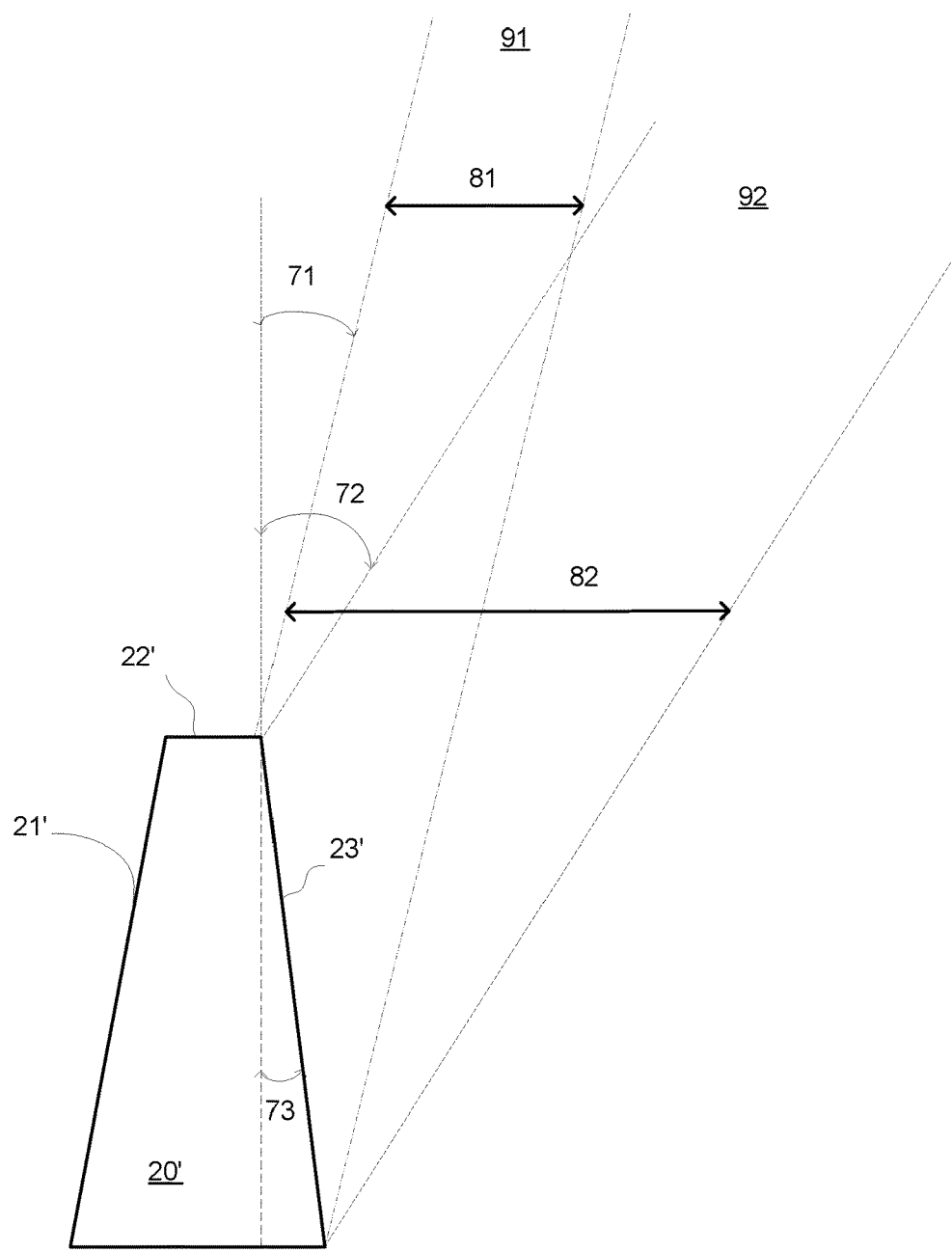
FIG. 3 is an example of a model of a non-ideal spacer.

FIG. 3 illustrates a trapezoid model 20' of first spacer 20. The trapezoid model 20' includes left sidewall 21', top surface 22', and right sidewall 23'. Both left sidewall 21' and right sidewall 23' have a positive angle—they are tilted away from the center of the model.

During a first measurement, a certain location of the right sidewall 23' is illuminated by a first electron beam 91 that has a first tilt angle Angle1 71. The outcome of the first measurement is a first right sidewall height value 81.

During a second measurement, the certain location of the right sidewall 23' is illuminated by second electron beam 92 that has a second tilt angle Angle2 72. The outcome of the second measurement is a second right sidewall height value 82.

First tilt angle Angle1 71 is smaller than second tilt angle Angle2 72.

The height of the right sidewall 23' at the certain location may be calculated as the ratio between (a) a difference between the second right sidewall height value and first right sidewall height value, and (b) a difference between the second tilt angle and first tilt angle.

The tilt 73 of the right sidewall 23' may be calculated based on the first right sidewall height value, the second right sidewall height value, the first tilt angle and the second tilt angle.

Assuming that the first right sidewall height value is denoted V1, the second right sidewall height value is denoted V2, then Tilt=acrtan $g([V1*\tangent(Angle2)-V2*\tangent(Angle1)]/[V2-V1])$.

Figure 4:
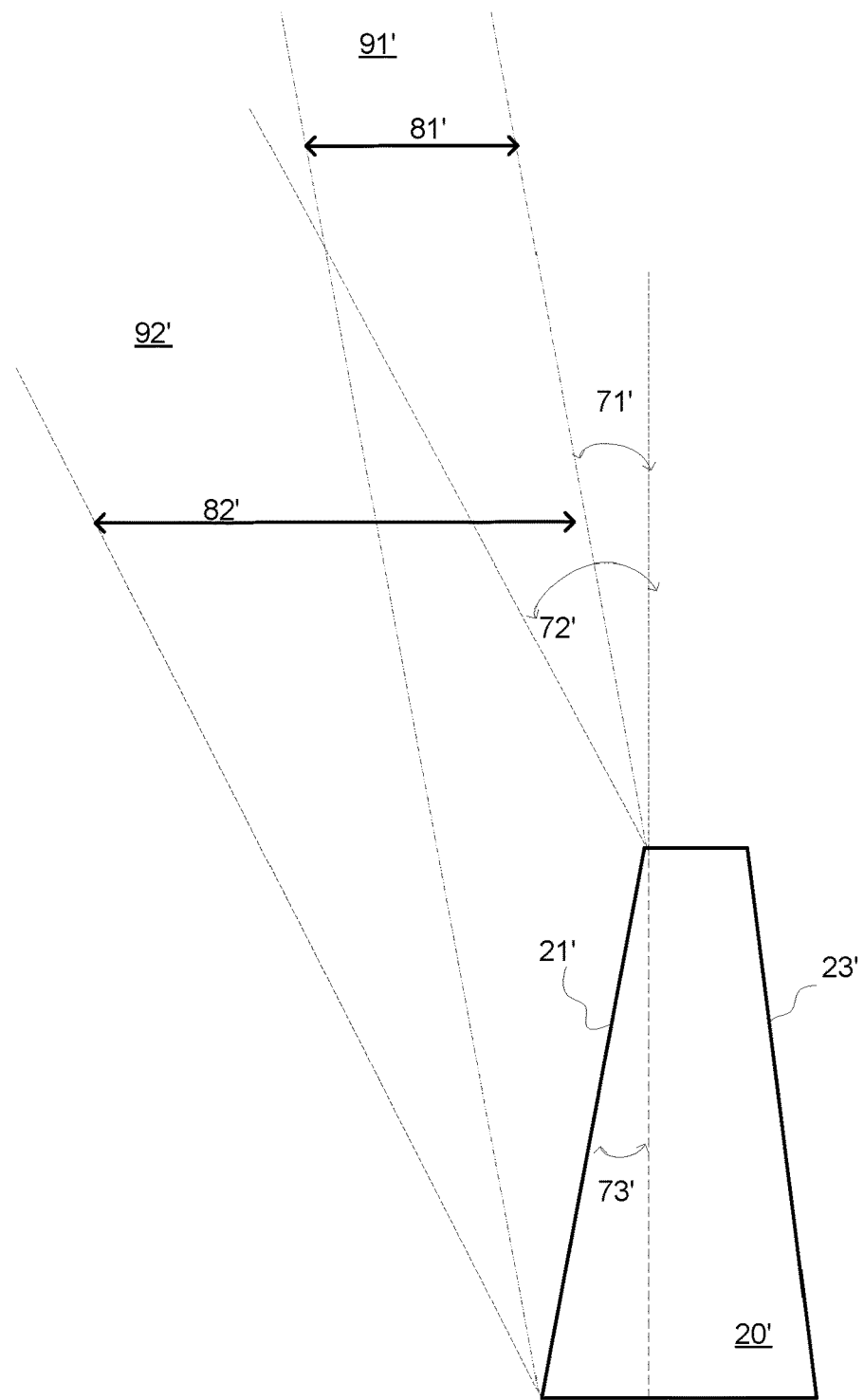
FIG. 4 is an example of a model of a non-ideal spacer.

FIG. 4 also illustrates trapezoid model 20' of first spacer 20. While FIG. 3 illustrates an illumination of the right sidewall 23'—FIG. 4 illustrates the illumination of left sidewall 21'.

During a third measurement, a certain location of the left sidewall 21' is illuminated by a third electron beam 91' that has a third tilt angle Angle3 71'. The outcome of the third measurement is a first left sidewall height value 81'.

During a fourth measurement, the certain location of the left sidewall 21' is illuminated by fourth electron beam 92' that has a fourth tilt angle Angle4 72'. The outcome of the fourth measurement is a second left sidewall height value 82'.

Third tilt angle Angle3 71' is smaller than fourth tilt angle Angle4 72'.

The height of the left sidewall 21' at the certain location may be calculated at the ratio between (a) a difference between the second left sidewall height values and the first left sidewall height value, and (b) a difference between the fourth tilt angle and the first tilt angle.

The tilt 73' of the left sidewall 21' may be calculated based on the first left sidewall value, the second left sidewall height value, the third tilt angle, and the fourth tilt angle.

Assuming that the first left sidewall height value is denoted V1', the second left sidewall height value is denoted V2', then Tilt=acrtan $g([V1'*\tangent(Angle4)-V2'*\tangent(Angle3)]/[V2'-V1'])$.

Figure 5:
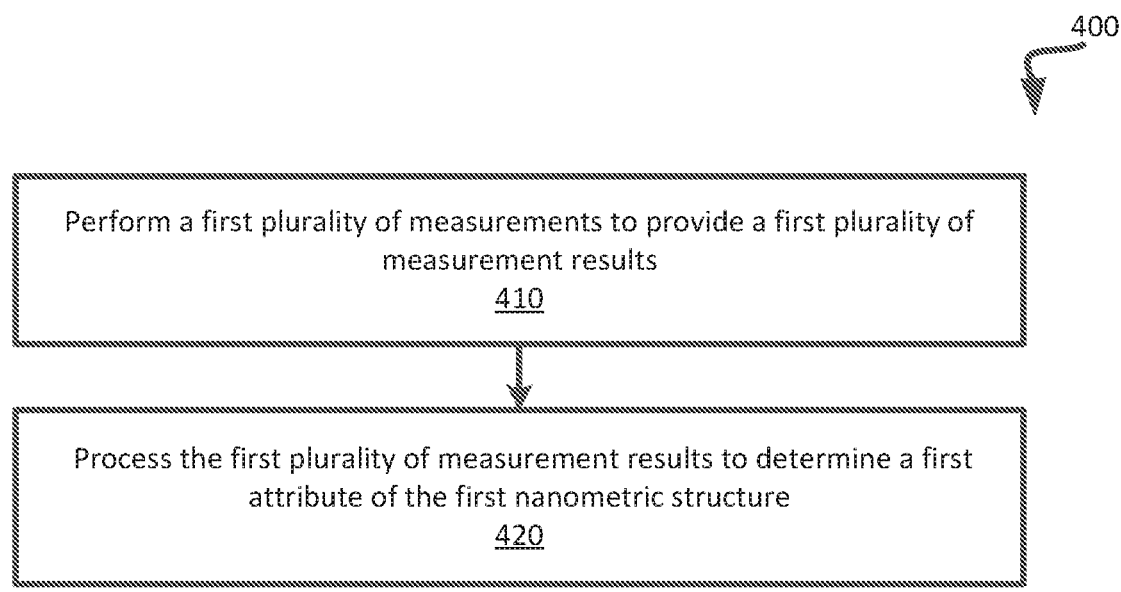
FIG. 5 illustrates an example of a method.

FIG. 5 illustrates an example of method 400.

Method 400 is for monitoring a first nanometric structure formed by a multiple patterning process. The multiple patterning process may be SAPD, SADQ or any other multiple patterning process.

Method 400 may start by step 410 of performing a first plurality of measurements to provide a first plurality of measurement results.

Step 410 may include illuminating first plurality of locations of a first sidewall of a first nanometric structure by oblique charged particle beams of different tilt angles. See, for example, FIG. 3.

It should be noted that the entire first sidewall may be illuminated—or at least multiple locations of the first sidewalls may be illuminated. Each location should be illuminated from different directions.

The oblique charged particle beams may be oriented by an angle that does not exceed any number out of five, ten, fifteen, twenty, twenty-five, thirty, thirty-five, forty, forty-five, fifty, fifty-five, sixty, sixty-five and seventy degrees from the upper surface of the nanometric structure.

The illumination of the first plurality of locations of the first sidewall is followed by an emission of charged particles and/or photons from the first sidewall. The charged particles and/or the photons are detected by one or more detectors. Detection signals of the one or more detectors are processed to generate the tilted image.

The one or more detectors may be positioned within a charged particle column and/or outside the charged particle column. These one or more detectors may be secondary electron detectors, backscattered electron detectors, x-ray detectors, and the like.

Step 410 may be followed by step 420 of processing, by a hardware processor, the first plurality of measurement results to determine a first attribute of the first nanometric structure.

While steps 410 and 420 were illustrated in relation to a single sidewall of a single nanometric structure—it should be noted that steps 410 and 420 can be applied on multiple sidewalls of one or more nanometric structures.

For example—step 410 may include performing a second plurality of measurements to provide a second plurality of measurement results, wherein the performing of the second plurality of measurements includes illuminating a second plurality of locations of a second sidewall of a second nanometric structure by oblique charged particle beams of different tilt angles. Step 420 may include processing, by the hardware processor, the second plurality of measurement results to determine a first attribute of the second nanometric structure.

Yet for another example—step 410 may include performing a third plurality of measurements to provide a third plurality of measurement results, wherein the performing of the third plurality of measurements includes illuminating a third plurality of locations of a second sidewall of the first nanometric structure by oblique charged particle beams of different tilt angles. Step 420 may include processing, by the hardware processor, the third plurality of measurement results to determine a second attribute of the first nanometric structure.

The first attribute and the second attribute may refer to any nanometric structure and/or to a spatial relationship between nanometric structures.

The first attribute and/or the second attribute of a nanometric structure may be related to any edge of the nanometric structure, to any sidewall of the nanometric structure, to a spatial relationship between multiple nanometric structures, to any spatial relationship between different parts of the nanometric structure. Non-limiting examples of the attribute include an edge roughness, any edge related statistics, a sidewall tilt, any sidewall tile related statistics, sidewall heights, any sidewall height statistics. The attribute of the nanometric structure may be a size attribute and/or a shape attribute.

The processing may involve performing a spatial frequency transform—for converting location information (for example—locations of pixels along a certain edge) to the spatial frequency domain and providing a first attribute and/or a second attribute (such as edge roughness) based on the spectrum (or parts of the spectrum) generated by the spatial frequency transform.

Step 410 may include receiving a first plurality of measurement results that were obtained from a first plurality of measurements that comprise illuminating first plurality of locations of a first sidewall of a first nanometric structure by oblique charged particle beams of different tilt angles.

Figure 6:
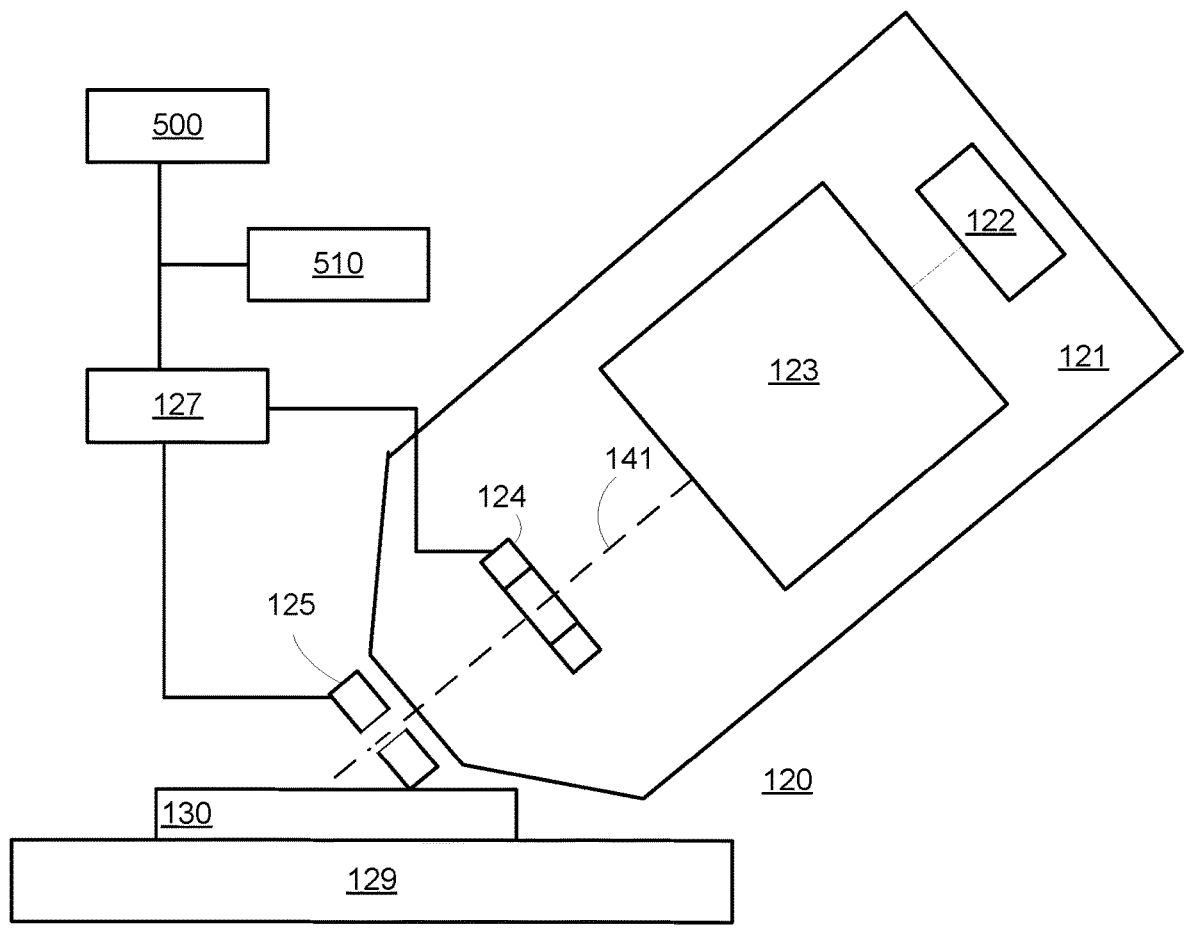
FIG. 6 is an example of a system.

FIG. 6 is an example of system 120 and wafer 130. Wafer 130 includes multiple nanometric structures.

System 120 is a charged particle device such as a scanning electron microscope. System 120 includes column 121, external electron detector 125, processor 127, mechanical stage 129, memory unit 500 and controller 510.

System 120 may include other components that are not shown for simplicity of explanation. The other components may include a vacuum chamber, an optical microscope, and various in-column detectors, and the like. Any detector may be a secondary electron detector, a backscattered electron detector, an EDX detector, and the like.

Controller 510 is configured to control the operation of system 120.

Mechanical stage 129 supports wafer 130 and may move wafer 130 in relation to column 121.

Column 121 is configured to generate a primary electron beam, to electrically deflect the primary electron beam and to detect (using one or more detectors) electrons emitted from the wafer 130.

Column 121 is illustrated as including electron source 122, electron optics 123 and in-column electron detector 124. The electron optics may deflect the primary electron beam, shape the primary electron beam, and the like. Components of the electron optics may include polarizers, deflectors, collimators, and the like.

The primary electron beam 141 is tilted (oblique angle) in relation to the wafer 130. In FIG. 6 the tilt is obtained by tilting the column 121.

The external electron detector 125 is positioned between column 121 and wafer 130.

Detection signals from the external electron detector 125 and the in-column electron detector 124 are fed to a processor 127.

Processor 127 may receive detection signals from other detectors.

Processor 127 may execute step 420 of method 400.

Processor 127 may be included in system 120 or may be located in another computerized system. Processor 127 may represent a combination of processing elements of system 120 and processing elements of the other computerized system.

Memory unit 510 may store at least one out of (a) information such as detection signals, attributes, and the like, and (b) program instructions.

The program instructions may include program instructions being configured to perform, when executed on a processor (such as processor 127) the steps of: receiving a first plurality of measurement results that were obtained from a first plurality of measurements that comprise illuminating first plurality of locations of a first sidewall of a first nanometric structure by oblique charged particle beams of different tilt angles; and processing the first plurality of measurement results to determine a first attribute of the first nanometric structure. The program instructions may be executed by a processor that is not included in system 120.

Controller 510 and processor 127 may be or may include one or more hardware processors such as image processors, general purpose processors, and the like.

Figure 7:
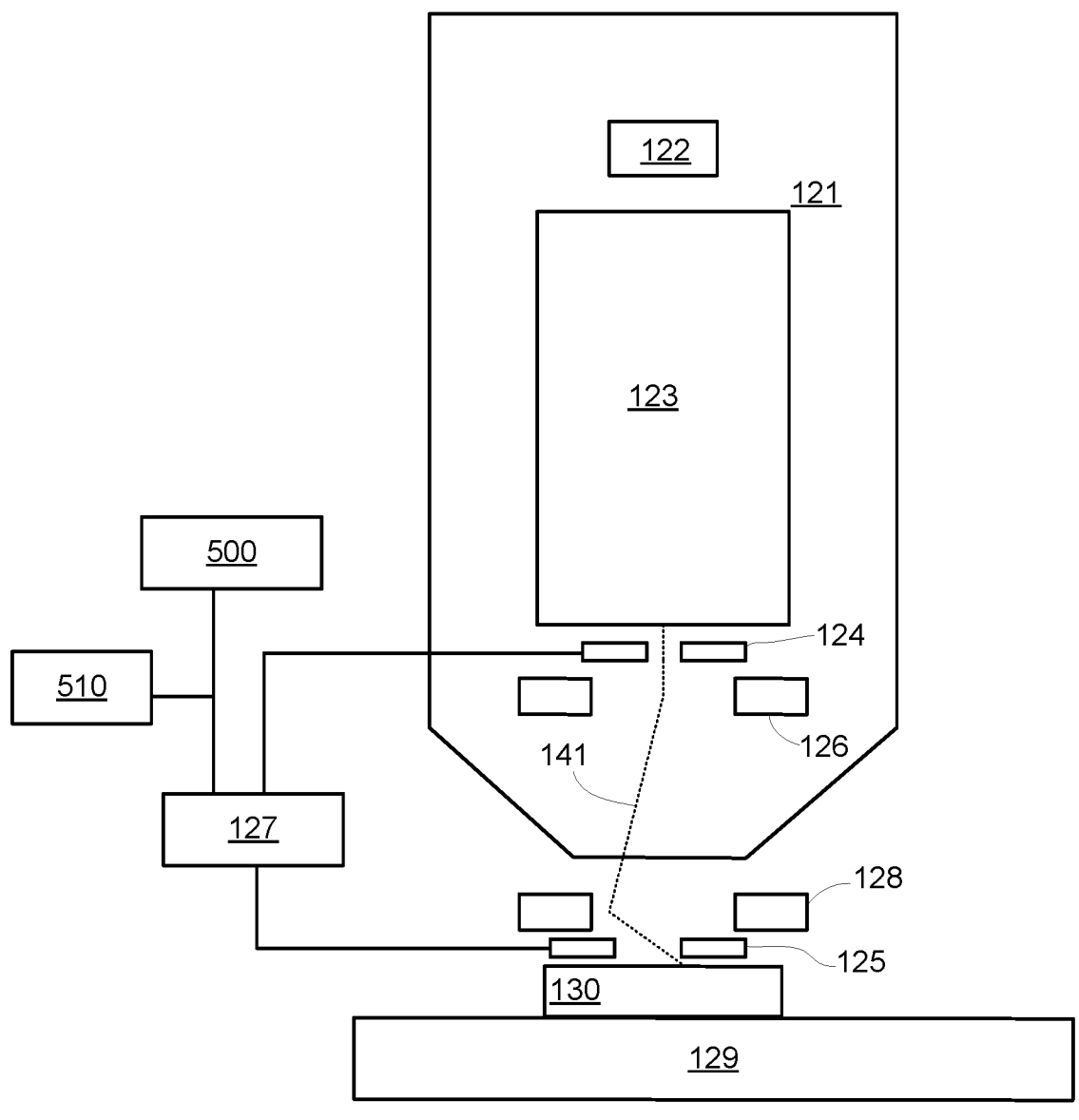
FIG. 7 is an example of a system.

FIG. 7 is an example of system 120' and wafer 130. Wafer 130 includes multiple nanometric structures.

While in FIG. 6 the tilt was obtained by a mechanical tilt—in FIG. 7 the tilt is obtained using deflection. It should be noted that the tilt of the primary electron beam may be obtained using both mechanical tilt and electron optics tilt.

System 120' of FIG. 7 differs from system 120 of FIG. 6 by:
  a. Having a column 121 that is normal to wafer 130.
  b. Including a pair of deflectors that double tilt the primary electron beam so that the primary electron beam impinges on the wafer 130 at an oblique angle.

The pair of deflectors includes an upper deflector 126 that is positioned within column 121, and a lower deflector 128 that is positioned between column 121 and the wafer 130.

It should be noted that system 120 of FIG. 6 and system 120' of FIG. 7 may include any number of deflectors.

Any of the mentioned above methods may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for monitoring a first nanometric structure formed by a multiple patterning process, the method comprising:
   performing a first plurality of measurements to provide a first plurality of measurement results by illuminating a first plurality of locations of a first sidewall of the first nanometric structure with oblique charged particle beams at different tilt angles;
   receiving a first tilt angle of the different tilt angles from which a first illumination beam is used to illuminate a particular location of the first plurality of locations of the first sidewall and a second tilt angle of the different tilt angles from which a second illumination beam is used to illuminate another location of the first plurality of locations of the first sidewall of the first nanometric structure; and
   processing, by a hardware processor, the first plurality of measurement results to determine a first attribute related to height uniformity of the first nanometric structure based on the first tilt angle from which the first illumination beam is used to illuminate the particular location and the second tilt angle from which the second illumination beam is used to illuminate the another location, and a difference between a measurement of the first plurality of measurements corresponding to an illumination of the particular location of the first sidewall of the first nanometric structure and another measurement of the first plurality of measurements corresponding to an illumination of the another location of the first sidewall of the first nanometric structure.

2. The method according to claim 1, wherein the first attribute of the first nanometric structure is the height uniformity of the first sidewall.

3. The method according to claim 1, wherein a second attribute of the first nanometric structure is a roughness of one or more edges of the first nanometric structure.

4. The method according to claim 1, further comprising:
   performing a second plurality of measurements to provide a second plurality of measurement results by illuminating a second plurality of locations of a second sidewall of a second nanometric structure with oblique charged particle beams at different tilt angles; and
   processing, by the hardware processor, the second plurality of measurement results to determine a first attribute of the second nanometric structure.

5. The method according to claim 4, wherein the first attribute of the second nanometric structure is the height uniformity of the second sidewall.

6. The method according to claim 4, wherein a second attribute of the second nanometric structure is a roughness of one or more edges of the second nanometric structure.

7. The method according to claim 4, further comprising:
   processing the first plurality of measurement results and the second plurality of measurement results to determine a spatial relationship between the first nanometric structure and the second nanometric structure.

8. A non-transitory computer storage medium comprising instructions, which when executed by a processor, cause the processor to perform operations comprising:
   receiving a first plurality of measurement results that were obtained from a first plurality of measurements corresponding to an illumination of a first plurality of locations of a first sidewall of a first nanometric structure with oblique charged particle beams at different tilt angles;
   receiving a first tilt angle of the different tilt angles from which a first illumination beam is used to illuminate a particular location of the first plurality of locations of the first sidewall and a second tilt angle of the different tilt angles from which a second illumination beam is used to illuminate another location of the first plurality of locations of the first sidewall of the first nanometric structure; and
   processing the first plurality of measurement results to determine a first attribute related to height uniformity of the first nanometric structure based on the first tilt angle from which the first illumination beam is used to illuminate the particular location and the second tilt angle from which the second illumination beam is used to illuminate the another location, and a difference between a measurement of the first plurality of measurements corresponding to an illumination of the particular location of the first sidewall of the first nanometric structure and another measurement of the first plurality of measurements corresponding to an illumination of the another location of the first sidewall of the first nanometric structure.

9. The non-transitory computer storage medium according to claim 8, wherein the first attribute of the first nanometric structure is the height uniformity of the first sidewall.

10. The non-transitory computer storage medium according to claim 8, wherein a second attribute of the first nanometric structure is a roughness of one or more edges of the first nanometric structure.

11. The non-transitory computer storage medium according to claim 8, the operations further comprising:
    receiving a second plurality of measurement results that were obtained from a second plurality of measurements corresponding to an illumination of a second plurality of locations of a second sidewall of a second nanometric structure with oblique charged particle beams at different tilt angles; and
    processing the second plurality of measurement results to determine a first attribute of the second nanometric structure.

12. The non-transitory computer storage medium according to claim 11, wherein the first attribute of the second nanometric structure is the height uniformity of the second sidewall.

13. The non-transitory computer storage medium according to claim 11, wherein a second attribute of the second nanometric structure is a roughness of one or more edges of the second nanometric structure.

14. A system comprising:
    a memory; and
    a processor, operatively coupled with the memory, to:
    receive a first plurality of measurement results that were obtained from a first plurality of measurements corresponding to an illumination of a first plurality of locations of a first sidewall of a first nanometric structure with oblique charged particle beams at different tilt angles;
    receive a first tilt angle of the different tilt angles from which a first illumination beam is used to illuminate a particular location of the first plurality of locations of the first sidewall and a second tilt angle of the different tilt angles from which a second illumination beam is used to illuminate another location of the first plurality of locations of the first sidewall of the first nanometric structure; and process the first plurality of measurement results to determine a first attribute related to height uniformity of the first nanometric structure based on the first tilt angle from which the first illumination beam is used to illuminate the particular location and the second tilt angle from which the second illumination beam is used to illuminate the another location, and a difference between a measurement of the first plurality of measurements corresponding to an illumination of the particular location of the first sidewall of the first nanometric structure and another measurement of the first plurality of measurements corresponding to an illumination of the another location of the first sidewall of the first nanometric structure.

15. The system of claim 14, wherein the first attribute of the first nanometric structure is the height uniformity of the first sidewall.

16. The system of claim 14, wherein a second attribute of the first nanometric structure is a roughness of one or more edges of the first nanometric structure.

17. The system of claim 14, wherein the processor is further to:

perform a second plurality of measurements to provide a second plurality of measurement results by illuminating a second plurality of locations of a second sidewall of a second nanometric structure with oblique charged particle beams at different tilt angles; and process the second plurality of measurement results to determine a first attribute of the second nanometric structure.

18. The system of claim 17, wherein the first attribute of the second nanometric structure is the height uniformity of the second sidewall.

19. The system of claim 17, wherein a second attribute of the second nanometric structure is a roughness of one or more edges of the second nanometric structure.

* * * * *